United States Patent
Kimura et al.

(10) Patent No.: US 6,718,528 B2
(45) Date of Patent: *Apr. 6, 2004

(54) LATCH-UP VERIFYING METHOD AND LATCH-UP VERIFYING APPARATUS CAPABLE OF VARYING OVER-SIZED REGION

(75) Inventors: Shinichi Kimura, Osaka (JP); Hiroyuki Tsujikawa, Shiga (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/303,470

(22) Filed: Nov. 25, 2002

(65) Prior Publication Data

US 2003/0074641 A1 Apr. 17, 2003

Related U.S. Application Data

(63) Continuation of application No. 09/542,576, filed on Apr. 4, 2000, now Pat. No. 6,490,709.

(30) Foreign Application Priority Data

Apr. 5, 1999 (JP) .......................................... 11-098013

(51) Int. Cl.[7] .............................................. G06F 17/50
(52) U.S. Cl. .................................. 716/5; 716/4; 716/6
(58) Field of Search ................................ 716/415, 5, 6, 716/8–14, 2, 10

(56) References Cited

U.S. PATENT DOCUMENTS

| | | | | |
|---|---|---|---|---|
| 5,638,286 | A | 6/1997 | Fujimoto | 364/488 |
| 6,003,024 | A | 12/1999 | Bair et al. | 716/12 |
| 6,028,991 | A * | 2/2000 | Akashi | 395/500.15 |
| 6,212,492 | B1 * | 4/2001 | Kuge | 703/15 |
| 6,329,845 | B1 * | 12/2001 | Taki | 326/102 |
| 6,490,709 | B1 * | 12/2002 | Kimura et al. | 716/5 |

FOREIGN PATENT DOCUMENTS

| | | |
|---|---|---|
| JP | 5-36822 | 2/1993 |
| JP | 7-130965 | 5/1995 |
| JP | 2774754 | 4/1998 |

OTHER PUBLICATIONS

Suzuki et al., "ESD and Latch–up Characteristics of Semiconductor Device With Thin Epitaxial Substrate," IEEE, Oct. 1998, pp. 3A.6. 1–3A.6.9.*
Kim et al., "Analysis and Prevention of DRAM Latch–up During Power–On," IEEE, Jan. 1997, pp. 79–85.*

* cited by examiner

*Primary Examiner*—Vuthe Siek
(74) *Attorney, Agent, or Firm*—Pearne & Gordon LLP

(57) ABSTRACT

With respect to layout data of a semiconductor integrated circuit, a latch-up verifying operation is carried out in high precision. In a latch-up verifying method, a well region, a transistor region, and a substrate contact region are extracted from layout data of a semiconductor integrated circuit formed on a semiconductor substrate; and steps for separately setting over-sizing values are sequentially executed based upon the respective extracted information.

27 Claims, 14 Drawing Sheets

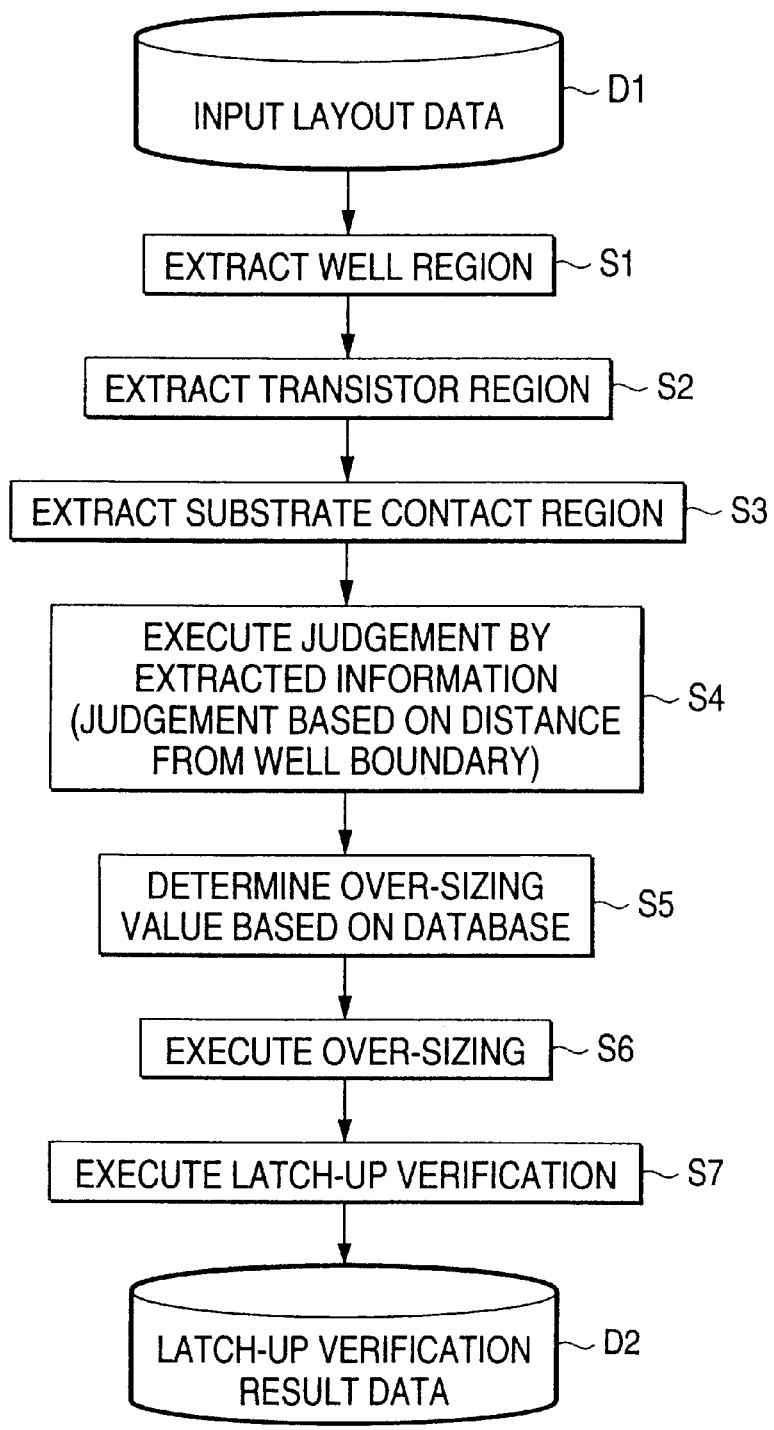

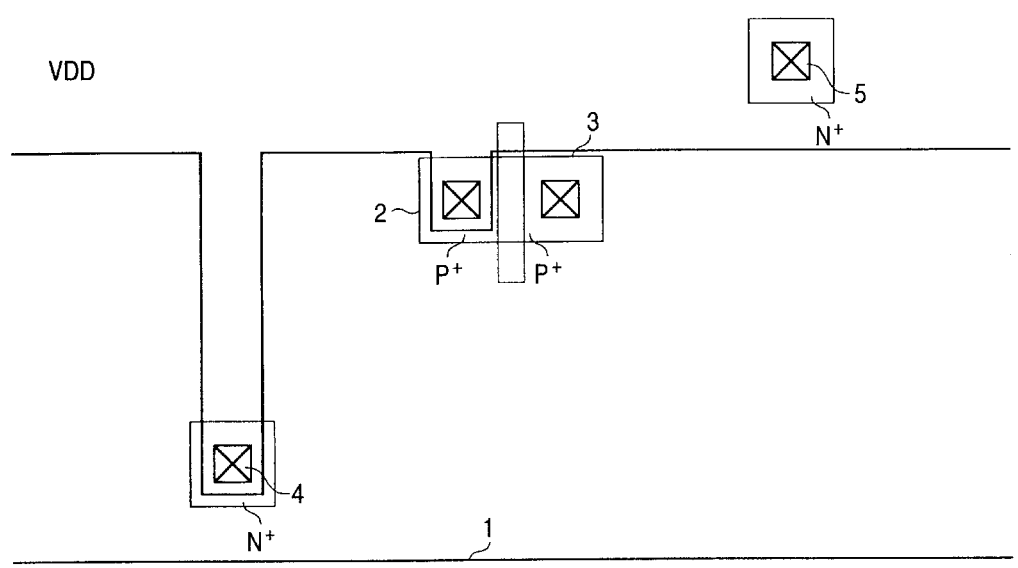
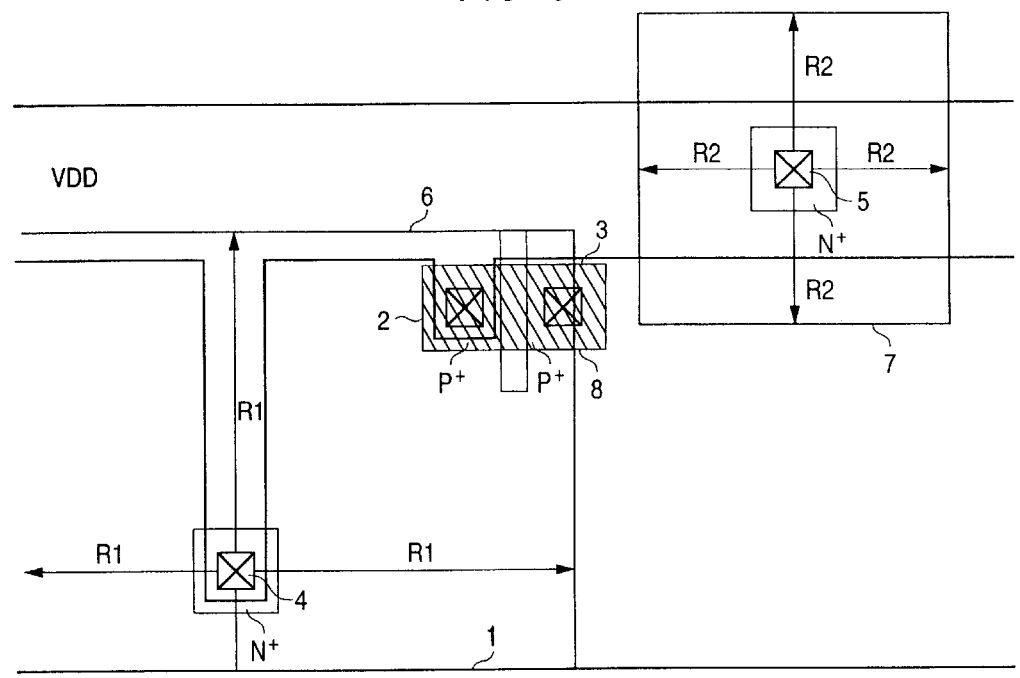

LATCH-UP VERIFYING METHOD AND LATCH-UP VERIFYING APPARATUS CAPABLE OF VARYING OVER-SIZED REGION

This is a continuation of U.S. application Ser. No. 09/542,576, filed Apr. 4, 2000, now U.S. Pat. No. 6,490,709.

BACKGROUND OF THE INVENTION

1. Field of the Invention

The present invention generally relates to a latch-up verifying method and a latch-up verifying apparatus for verifying layout data of a semiconductor integrated circuit. More specifically, the present invention is directed to latch-up verifying method/apparatus capable of varying an over-sized region, depending upon structural conditions and also electric characteristics of semiconductor integrated circuits.

2. Description of the Related Art

Very recently, while semiconductor integrated circuits are manufactured in very fine manners, occurrence potentials of erroneous IC operations caused by a so-called "latch-up" phenomenon are increased. In a CMOS (complementary MOS) semiconductor integrated circuit, it is normally known that a "latch-up" phenomenon occurs. That is, while such CMOS semiconductor integrated circuits are manufactured in a very fine manner and in a high integration, parasitic transistors are formed. Under such a circumstance, when such a phenomenon happens to occur that a base current along a forward direction may flow through any one of a PNP transistor and an NPN transistor, which constitute a CMOS semiconductor integrated circuit, both the PNP transistor and the NPN transistor are simultaneously turned ON to be therefore brought into a positive feedback condition. Thus, these ON states of the PNP/NPN transistors are not ceased unless supplying of electric power to these transistors is interrupted.

As one of effective solving items, there is a latch-up verifying method executed based upon layout data.

This sort of conventional latch-up verifying method is described in, for instance, Japanese Laid-open Patent Application No. Hei-7-130965 opened in 1995. Concretely speaking, this conventional latch-up verifying method is constituted by: at least a well region extracting step; a transistor region extracting step; a substrate contact region extracting step; an over-sizing executing step; and a latch-up verifying step. This conventional latch-up verifying method employs the distance between the substrate contact region and the transistor region as the verifying material.

Next, one conventional latch-up verifying method will now be explained.

FIG. 13 is a flow chart for describing this conventional latch-up verifying method. This conventional latch-up verifying method verifies as to whether or not a distance between a substrate contact region and a transistor region is equal to such a distance which can sufficiently avoid an occurrence of a so-called latch-up phenomenon in accordance with a preset over-sizing value. This over-sizing value is previously set based upon input layout data D1. As a result, latch-up verification data D12 is obtained. In other words, this conventional latch-up verifying method is constituted by: a step S1 for extracting a well region; a step S2 for extracting a transistor region; a step S3 for extracting a substrate contact region; a step S16 for executing a so-called "over-sizing step", namely for drawing a safe range from the substrate contact region by using a value set every process; and also a latch-up verifying step S7 for verifying as to whether or not the transistor region is not deviated from, or is sticking out from the over-sized region, i.e., the safe range.

Next, operations of the above-explained latch-up verifying method with employment of the above-described steps will now be explained in detail.

At the first step S1, the well region is extracted based on the input layout data D1. Next, the transistor region is extracted based upon the input layout data DI at the step S2. At the subsequent step S3, the substrate contact region is extracted based on the input layout data D1. At the step S16, the safe range (namely, over-sized region) from the substrate contact region is drawn based upon the various data extracted from the step S1, the step S2, and the step S3, while employing a constant value set every process as over-sized data, and then the over-sizing step is executed. The latch-up verification defined at the step S7 is executed. That is to say, the logic calculation is carried out between the safe range where the over-sizing step is executed at the step S16, namely the substrate contact region enlarged (over-sized) by the over-sizing step, and the transistor region extracted at the step S2. As a result, the transistor region existing outside the over-sizing region of the substrate contact region set in the above-explained over-sizing step is extracted. As a result of the extracting execution of this step S7, the latch-up verification resultant data D12 is obtained.

However, this conventional latch-up verifying method owns the following problem. That is, since the over-sizing value is set to such a constant value with respect to each process, the latch-up verification cannot be executed in high precision.

SUMMARY OF THE INVENTION

The present invention has been made to solve the above-described problem of the conventional latch-up verifying method, and therefore, has an object to provide a latch-up verifying method and a latch-up verifying apparatus, capable of executing latch-up verification in high precision.

To achieve the above-explained object, when latch-up verification for layout data is carried out, a well region, a transistor region, and a substrate contact region are extracted from the layout data. Thereafter, an over-sized region is set by (respectively) separately setting over-sizing values based upon the extracted information of the above-explained regions, and by executing an over-sizing step for the substrate contact region. Then, the latch-up verification can be executed in high precision by judging as to whether the transistor region is contained in this over-sized region.

A latch-up verifying method, according to a first aspect of the present invention, is featured by that a well region, a transistor region, and a substrate contact region are extracted from layout data of a semiconductor integrated circuit formed on a semiconductor substrate; and steps for separately setting over-sizing values are sequentially executed based upon the respective extracted information, whereby latch-up verification of the layout data is executed.

In accordance with the above-described arrangement, since the over-sized values are separately set based upon the respective extracted information of the well region, the transistor region, and the substrate contact region from the layout data of the semiconductor integrated circuit formed on the, semiconductor substrate, the judgement can be carried out by considering various conditions. As a result, the latch-up verification can be done in high precision. In other words, an occurring risk of such a latch-up phenomenon will largely depend upon the structural condition and the current capability (electric characteristic). The structural condition is defined from the positional relationship among the respective regions, for instance, the distance of the region from the well region; and further defined from the conductivity type of the semiconductor substrate, the carrier density, and the dimension of the contact region. As a result, since the over-sizing region is set by considering these conditions, the latch-up verification precision can be largely increased.

Also, a latch-up verifying method, according to a second aspect of the present invention, is featured by such a latch-up verifying method of the first aspect, wherein: the latch-up verifying method is comprised of: a step for forming a database used to store an over-sizing value; a first extraction step for extracting a well region from the layout data; a second extraction step for extracting a transistor region from the layout data; a third extraction step for extracting a substrate contact region from the layout data; an over-sizing determining step for determining an over-sizing value based upon the extracted information obtained from the first extraction step to the third extraction step with reference to the over-sizing value database; a step for defining an over-sized region based upon the over-sizing value; and a step for executing the latch-up verification by checking as to whether or not the transistor region is contained within the over-sized region defined at the definition step.

In accordance with the above arrangement, while the over-sizing value is saved in the database, the over-sizing value is determined based on the extracted information of the well region, the transistor region, and the substrate contact region with reference to the over-sizing value database. As a result, the latch-up verification can be carried out in very high precision similar to the first aspect.

Also, a latch-up verifying method, according to a third aspect of the present invention, is featured by such a latch-up verifying method of the second aspect, wherein: the over-sizing determination step is arranged by determining the over-sizing value based upon any one of a structural condition and a use condition as to each of the transistor regions of the semiconductor integrated circuit.

In accordance with the above arrangement, the over-sizing value is determined based upon either the structural condition or the electrical characteristic of each of the transistor regions provided in the semiconductor integrated circuit. As a result, the latch-up verification can be carried out in very high precision.

Also, a latch-up verifying method, according to a fourth aspect of the present invention, is featured by such a latch-up verifying method of the third aspect, wherein: the over-sizing determination step is arranged by determining the over-sizing value based upon a position relationship among the transistor region, the well region, and the substrate contact region.

Also, a latch-up verifying method, according to a fifth aspect of the present invention, is featured by such a latch-up verifying method of the fourth aspect, wherein: the over-sizing determination step is arranged by determining the over-sizing value based upon a distance defined between the well region and the transistor region.

Also, a latch-up verifying method, according to a sixth aspect of the present invention, is featured by such a latch-up verifying method of the fourth aspect, wherein: the over-sizing determination step is arranged by determining the over-sizing value based upon a distance defined between the well region and the substrate contact region.

In accordance with the above arrangement, the over-sizing determining step determines the over-sizing value based upon the positional relationship among the transistor region, the well region, and the substrate contact region. As a result, the latch-up verification can be carried out in very high precision. For instance, the shorter the distance between the region and the well edge is decreased, the smaller the latch-up phenomenon occurs. As a result, the occurrence condition of such a latch-up phenomenon may largely differ, depending upon the positional relationship. For example, the over-sizing value can be increased. Thus, the latch-up verification can be carried out in very high precision, while considering this positional relationship.

Also, a latch-up verifying method, according to a seventh aspect of the present invention, is featured by such a latch-up verifying method of the third aspect, wherein: the over-sizing determination step is arranged by determining the over-sizing value, while considering a dimension of the transistor region.

In accordance with the above arrangement, the over-sizing determining step determines the over-sizing value of the transistor region based upon the dimension of the transistor region. As a result, the latch-up verification can be carried out in very high precision. For instance, the larger the dimension of the transistor region is increased, the larger the over-sizing value can be increased. Thus, the latch-up verification can be carried out in very high precision, while considering this dimension of the transistor region.

Also, a latch-up verifying method, according to an eighth aspect of the present invention, is featured by such a latch-up verifying method of the third aspect, wherein: the over-sizing determination step is arranged by determining the over-sizing value, while considering a gate length and/or a gate width of the transistor region.

With employment of the above-explained arrangement, the over-sizing value is determined by considering the gate width of the transistor region and/or the gate length thereof. As a result, the latch-up verification can be carried out in very high precision. The larger the gate width becomes, the higher the current can be supplied, so that the latch-up phenomenon can hardly happen to occur. As a consequence, the larger the gate width is increased, the over-sizing value of the transistor region may be made smaller. Also, the longer the gate length is increased, the larger the channel resistance is increased, so that the latch-up phenomenon can readily happen to occur. As a result, the longer the gate length is increased, the over-sizing value of the transistor region must be made large. As previously explained, the latch-up verification can be carried out in very high precision, while considering the gate width and the gate length. Conversely, on the other hand, when the over-sizing value of the substrate contact region is adjusted, the larger the gate width is increased, the over-sizing value of the substrate contact region must be made large. It should be noted that the entire step for adjusting the over-sizing value of the transistor region can be made simpler. Alternatively, the over-sizing value of the substrate contact region may be adjusted, if required.

Also, a latch-up verifying method, according to a ninth aspect of the present invention, is featured by such a latch-up verifying method of the third aspect, wherein: the over-sizing determination step is arranged by determining the over-sizing value in correspondence with a current capability of each of the transistor regions of the semiconductor integrated circuit.

In accordance with this arrangement, the over-sizing determining step is arranged so as to determine the over-sizing value in response to the current capability of each of the transistor regions. In such a case that a larger current may be supplied, the latch-up phenomenon can hardly happen to occur. As a consequence, the over-sizing value of the transistor region may be made smaller, or the over-sizing value of the subtract contract region may be made larger. The latch-up verification can be carried out in very high precision by considering these conditions.

Also, a latch-up verifying method, according to a tenth aspect of the present invention, is featured by such a latch-up verifying method of the third aspect, wherein: the semiconductor integrated circuit is equipped with a salicide wiring structure; the substrate contact region is constituted by a via-hole-containing contact region for contacting through a via-hole within the semiconductor substrate, and a surface contact region formed on a surface of the semiconductor substrate, while does not contact through a via-hole within the semiconductor substrate; and the over-sizing determining step judges as to whether the substrate contact region is the via-hole-containing contact region, or the surface contact region, and is arranged by reducing the over-sizing value in the case that the substrate contact region is the surface contact region.

In accordance with this arrangement, in the semiconductor device equipped with the salicide wiring structure, also, the substrate contact region having no via-hole is added to the judgement subject by changing the judgement condition. In other words, the inverters of this Patent Application could find out such a fact that the substrate contact region without such a via-hole can also prevent the occurrence of the latch-up phenomenon, and thus could employ this fact. Also, a contact region where a via-hole is not formed can be formed with having a very narrow width, as compared with another contact region where a via-hole is formed. Since this contact region without such a via-hole can be formed in a very narrow region, this contact region becomes very effective. Such a "surface contact region" is conducted, and the latch-up verification is carried out by considering this surface contact region. As a result, it is possible to obtain the contact structure in higher precision, whose occupied area is very small.

Also, a latch-up verifying method, according to an 11-th aspect of the present invention, is featured by such a latch-up verifying method of the first aspect, or the second aspect, the over-sizing value database is constituted by such a function that one of the structural characteristic and the electric characteristic of each of the transistor regions of said semiconductor integrated circuit is used as a parameter; and the over-sizing value is determined by the function.

Also, a latch-up verifying method, according to a 12-th aspect of the present invention, is featured by such a latch-up verifying method of the first aspect, or the second aspect, the over-sizing value database is constituted by such a table containing a parameter made of one of the structural characteristic and the electric characteristic of each of the transistor regions of the semiconductor integrated circuit; and the over-sizing value is determined by the table.

In accordance with this arrangement, the over-sizing value database is arranged by either the function or the table, in which the structural condition or the electric characteristic of the each of the transistor regions provided in the semiconductor integrated circuit is employed as the parameter. As a result, the over-sizing value can be very easily determined by this function.

Also, a latch-up verifying method, according to an 13-th aspect of the present invention, is featured by such a latch-up verifying method of the first aspect, or the second aspect, the over-sizing value along a horizontal direction is made different from the over-sizing value along a vertical direction. Also, a latch-up verifying method, according to an 14-th aspect of the present invention, is featured by such a latch-up verifying method of the first aspect, or, the second aspect, the over-sizing value at a right hand along a horizontal direction is made different from the over-sizing value at a left hand along the horizontal direction; or the over-sizing value at an upper hand along a vertical direction is made different from the over-sizing value at a lower hand along the vertical direction.

In accordance with this arrangement, the over-sizing values are set to be made different from each other along both the horizontal direction and the vertical direction, otherwise, along both the right horizontal direction and the left horizontal direction, and along both the upper vertical direction and the lower vertical direction. In other words, for instance, the safe range of the transistor region along the channel width direction is different from the safe range of the transistor region along the channel length direction. The over-sizing value of the transistor region along the channel length direction is smaller than that along the channel width direction. Since the over-sizing values are determined by considering such a direction, the latch-up verification can be carried out in very high precision.

To achieve the above-described object, a latch-up verifying apparatus, according to a 15-th aspect of the present invention, is featured in that a well region, a transistor region, and a substrate contact region are extracted from layout data of a semiconductor integrated circuit formed on a semiconductor substrate; and steps for separately setting over-sizing values are sequentially executed based upon the respective extracted information, whereby latch-up verification of the layout data is executed.

A latch-up verifying apparatus, according to a 16-th aspect of the present invention, is featured in such a latch-up verifying apparatus of the 15-th aspect, the latch-up verifying apparatus is comprised of: a database used to store an over-sizing value; first extraction means for extracting a well region from the layout data; second extraction means for extracting a transistor region from the layout data; third extraction means for extracting a substrate contact region from the layout data; over-sizing determining means for determining an over-sizing value based upon the extracted information obtained from the first extraction means to the third extraction means with reference to the over-sizing value database; definition means for defining an over-sizing region based upon the over-sizing value; and verification means for executing the latch-up verification by checking as to whether or not the transistor region is contained within the over-sizing region defined at the definition means.

A latch-up verifying apparatus, according to a 17-th aspect of the present invention, is featured in such a latch-up verifying apparatus of the 16-th aspect, the determination means is arranged by determining the over-sizing value based upon any one of a structural condition and a use condition as to each of the transistor regions of the semiconductor integrated circuit.

A latch-up verifying apparatus, according to a 18-th aspect of the present invention, is featured in such a latch-up verifying apparatus of the 17-th aspect, the determination means is arranged by determining the over-sizing value based upon a position relationship among the transistor region, the well region, and the substrate contact region.

A latch-up verifying apparatus, according to a 19-th aspect of the present invention, is featured in such a latch-up verifying apparatus of the 18-th aspect, the determination means is arranged by determining the over-sizing value based upon a distance defined between the well region and the transistor region.

A latch-up verifying apparatus, according to a 20-th aspect of thee present invention, is featured in such a latch-up verifying apparatus of the 18-th aspect, the determination means is arranged by determining the over-sizing value based upon a distance defined between the well region and the substrate contact region.

A latch-up verifying apparatus, according to a 21st aspect of the present invention, is featured in such a latch-up verifying apparatus of the 17-th aspect, the determination means is arranged by determining the over-sizing value, while considering a dimension of the transistor region.

A latch-up verifying apparatus, according to a 22nd aspect of the present invention, is featured in such a latch-up verifying apparatus of 16-th aspect, the determination means is arranged by determining the over-sizing value, while considering a gate length and/or a gate width of the transistor region.

A latch-up verifying apparatus, according to a 23rd aspect of the present invention, is featured in such a latch-up verifying apparatus of the 16-th aspect, the determination means is arranged by determining the over-sizing value in correspondence with a current capability of each of the transistor regions of the semiconductor integrated circuit.

A latch-up verifying apparatus, according to a 24-th aspect of the present invention, is featured in such a latch-up verifying apparatus of the 15-th aspect, or the 16-th aspect, the over-sizing value database is constituted by such a function that one of the structural characteristic and the electric characteristic of each of the transistor regions of the semiconductor integrated circuit is used as a parameter; and the over-sizing value is determined by the function.

A latch-up verifying apparatus, according to a 25-th aspect of the present invention, is featured in such a latch-up verifying apparatus of the 15-th aspect, or the 16-th aspect, the over-sizing value database is constituted by such a table containing a parameter made of one of the structural characteristic and the electric characteristic of each of the transistor regions of the semiconductor integrated circuit; and the over-sizing value is determined by the table.

In such a latch-up verifying apparatus, the latch-up verification can be carried out in high precision.

BRIEF DESCRIPTION OF THE DRAWINGS

For a better understanding of the present invention, reference is made of a detailed description to be read in conjunction with the accompanying drawings, in which:

FIG. 1 is a flow chart for describing operations of a latch-up verifying method according to a first embodiment mode of the present invention;

FIG. 2 is a diagram for illustratively showing layout data used to explain the latch-up verifying method of the first embodiment mode;

FIG. 3 is a diagram for illustratively representing another layout data used to explain the latch-up verifying method of the first embodiment mode;

DESCRIPTION OF THE PREFERRED EMBODIMENTS

Figure 4:
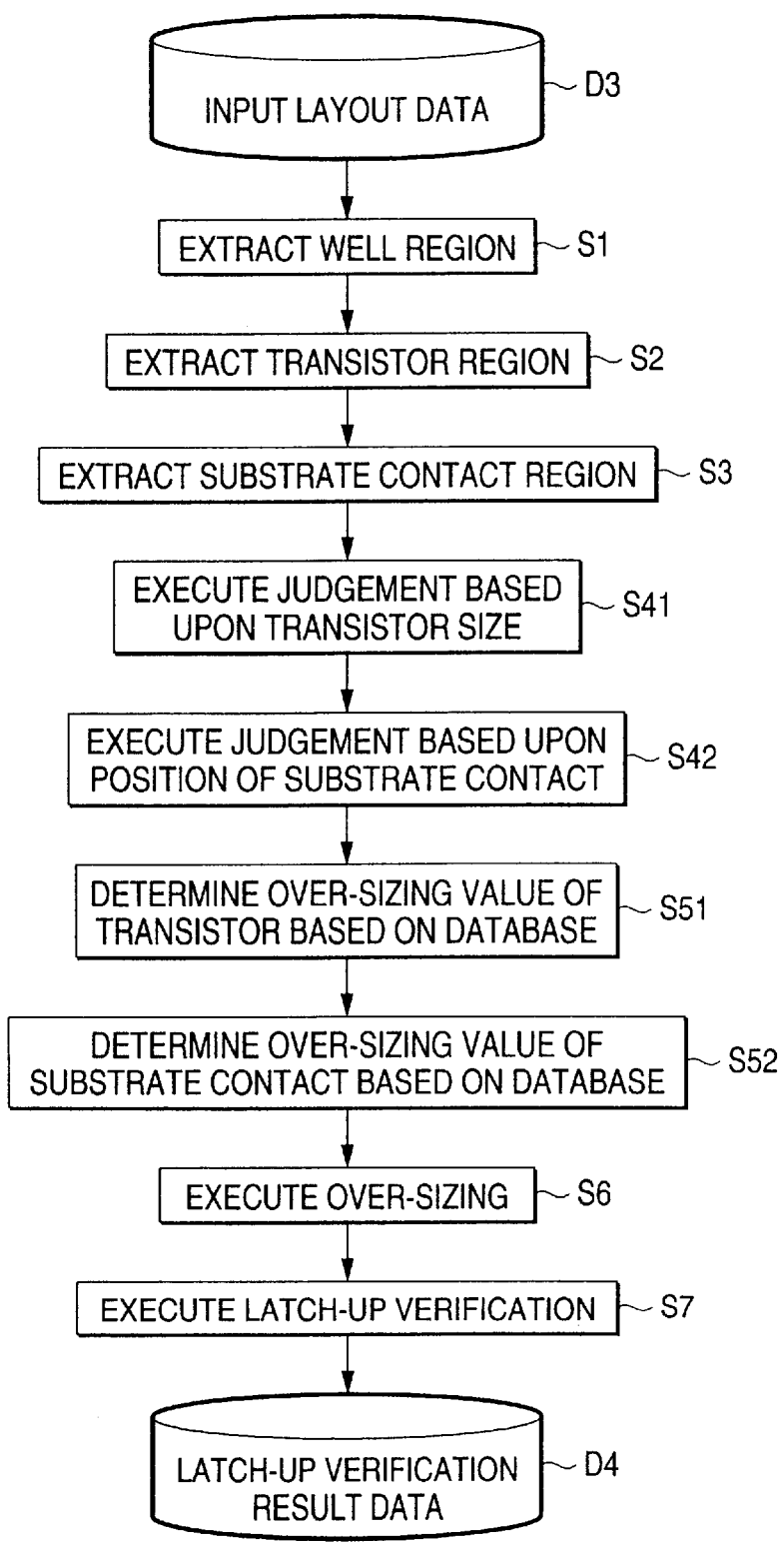
FIG. 4 is a flow chart for describing operations of a latch-up verifying method according to a second embodiment mode of the present invention.

Referring now to drawings, various preferred embodiments of the present invention will be described.

First Latch-up Verifying Method

A latch-up verifying method, according to a first embodiment mode of the present invention, will now be described with reference to FIG. 1 through FIG. 3.

FIG. 1 is a flow chart for describing the latch-up verifying method according to this first embodiment mode of the present invention. As indicated in a layout diagram of FIG. 2, input layout data D1 of FIG. 1 contains positions, dimensions, conductivity types, carrier density, and the like with respect to a well boundary 1, a source-sided transistor region 2, a drain-sided transistor region 3, and substrate contact regions 4 and 5. Also, FIG. 3 illustratively shows such a layout data diagram that since an over-sizing region defining step is carried out, both an over-sizing substrate contact region 6 and another over-sizing substrate contact region 7 are obtained, and then such a transistor region which is not contained in these contact region 6 and 7 is verified as an error transistor region 8 by executing the latch-up verification. This over-sizing substrate contact region 6 is made by enlarging the substrate contact region 4. The over-sizing substrate contact region 7 is made by enlarging the substrate contact region 5.

At a first step S1 of this flow chart, a well region is extracted from the above-explained input layout data D1. Thus, a well region boundary 1 is extracted at this step S1.

Next, at a step S2, a transistor region is extracted based upon the input layout data D1. At this step S2, both the source-sided transistor region 2 and the drain-sided transistor region 3 are extracted.

At a next step S3, both the substrate contact region 4 and the substrate contact region 5 are extracted from the input layout data D1.

At a further step S4, positional relationships of the respective regions are judged based upon the extracted information acquired at the step S1, the step S2, and the step S3. At this step S4, the substrate contact region 4 is judged as such a substrate contact region located close to the well region boundary 1, whereas the substrate contact region 5 is judged as such a substrate contact region located apart from the well region boundary 1. In this embodiment, these substrate contact regions are classified into two regions, while using a certain threshold value as a boundary, namely "close substrate contact region", and "remote substrate contact region".

Next, at a step SD, an over-sizing value of the substrate contact region 4 is determined as an R1, and an over-sizing value of the substrate contact region 5 is determined as an R2 (condition is R1>R2).

At a further step S6, an over-sizing region definition is carried out based upon the oversize values determined at the previous step SD (will be referred to as an "over-sizing is executed" hereinafter).

The over-sizing execution result of this step S6 is conceptionally indicated as a layout data diagram of FIG. 3.

At a step S7, a latch-up verifying operation is carried out. That is, a logic calculation is carried out as to the substrate contact region 6 after the oversize is executed, the substrate contact region 7 after the over-sizing is executed, the source-sided transistor region 2, and furthermore, the drain-sided transistor region 3. As a result of this logic calculation, such an error transistor region 8 is outputted as latch-up verification data D2. This error transistor region 8 is located outside the regions of the substrate contact region 6 and of the substrate contact region 7 after the over-sizing is executed.

As previously explained, in accordance with this first embodiment mode, since the process operations defined from the step S1 to the step S7 are carried out, the larger over-sizing value of the substrate contact region located close to the well region boundary 1 may be set, as compared with that of the substrate contact region located apart from the well region boundary 1. In other words, while the over-sizing values are separately set, the over-sizing can be executed. As a consequence, the latch-up verification can be executed in high precision.

Second Latch-up Verifying Method

A latch-up verifying method, according to a second embodiment mode of the present invention, will now be described with reference to FIG. 4 through FIG. 6.

Figure 5:
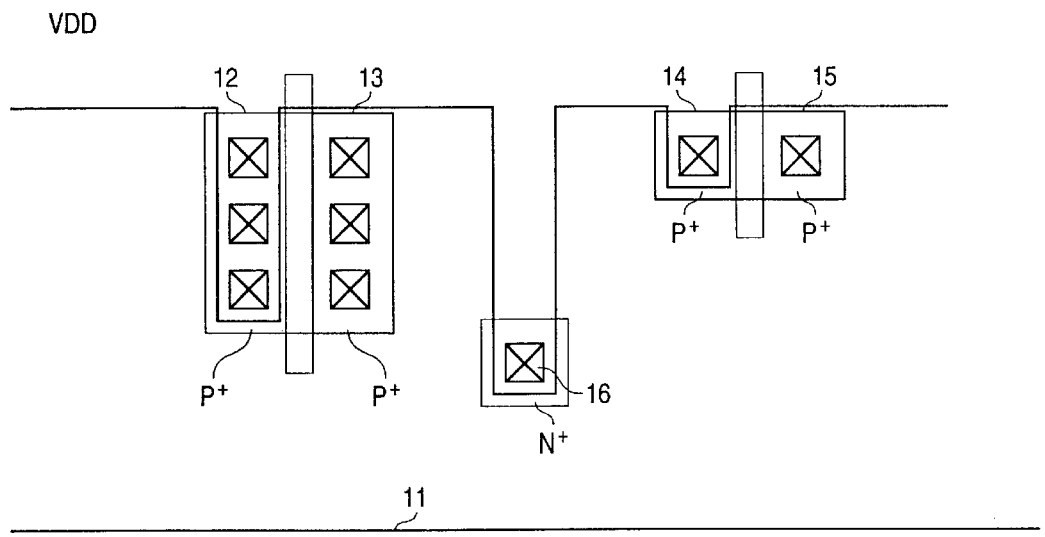
FIG. 5 is a diagram for illustratively showing layout data used to explain the latch-up verifying method of the second embodiment mode.
Figure 6:
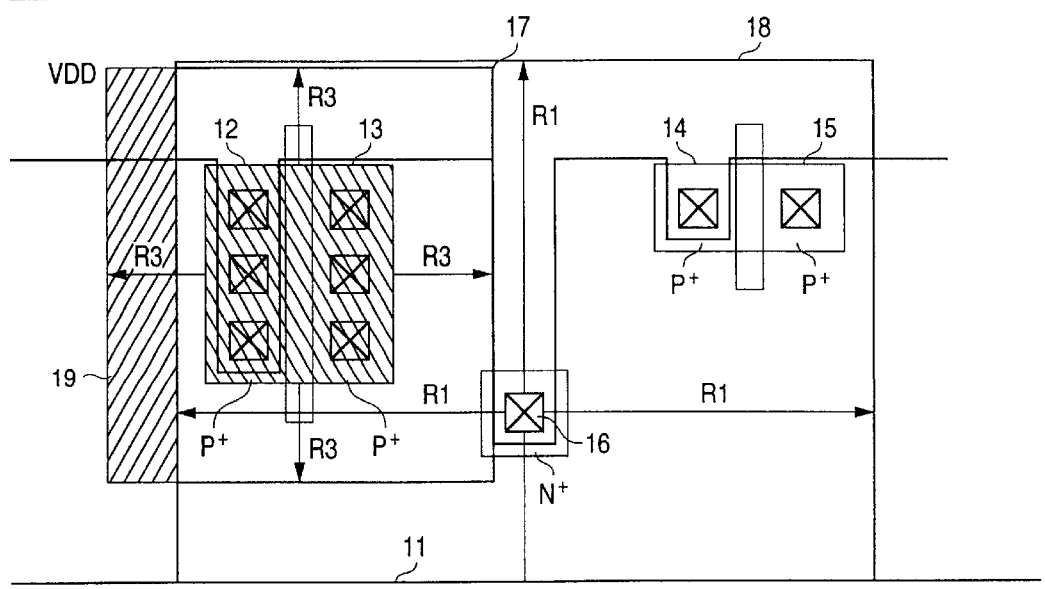
FIG. 6 is a diagram for illustratively representing another layout data used to explain the latch-up verifying method of the second embodiment mode.

Input layout data D3 of a flow chart shown in FIG. 4 corresponds to a layout data diagram of FIG. 5. In FIG. 5, reference numeral 11 indicates a well boundary, reference numeral 12 shows a source-sided transistor region, and reference 13 represents a drain-sided transistor region. Also, reference numeral 14 shows a source-sided transistor region, reference numeral 15 indicates a drain-sided transistor region, and reference numeral 16 represents a substrate contact region. In FIG. 6, reference numeral 17 shows an over-sized transistor region obtained by executing an over-sizing step as to the source-sided transistor region 12 and the drain-sided transistor region 13, reference numeral 18 indicates a substrate contact region obtained by executing an over-sizing step as to the substrate contact region 16, and reference numeral 19 represents an error transistor region obtained by executing a latch-up verification operation.

At a first step S1 of this flow chart, a well region is extracted from the above-explained input layout data D3. Thus, a well region 11 is extracted at this step S1.

Next, at a step S2, a transistor region is extracted based upon the input layout data D3. At this step S2, both the source-sided transistor region 12 and the drain-sided transistor region 13 can be extracted, and also the source-sided transistor region 14 and the drain-sided transistor region 15 can be extracted.

At a further step S3, the substrate contact region 16 is extracted based on the input layout data D3.

At a step S41, a dimension of a transistor region is judged based upon the extracted information acquired at the previous step S2. At this step S41, it is so judged that both the source-sided transistor region 12 and the drain-sided transistor region 13 are transistor regions having large dimensions. At this step, the transistor regions are classified into two regions, namely a large-sized transistor region and a small-sized transistor region, while setting a certain threshold value as a boundary (namely, judgement is made based on transistor size).

At a further step S42, positional relationships of the respective regions are judged based upon the extracted information acquired at the step S1 and the step S3. At this step S42, the substrate contact region 16 is judged as such a substrate contact region located close to the well boundary 11.

At a step S51, both the over-sizing value of the source-sided transistor region 12 and the over-sizing value of the drain-sided transistor region 13 are determined as an R3 and are used as a region for a large transistor size.

Next, at a step S52, while the substrate contact region 16 is set as a substrate contact region located close to the well region boundary 11, the over-sizing value is determined as an R1 (condition is R3<R1).

At a step S6, an over-sizing step of the source-sided transistor region 12, an over-sizing step of the drain-sided transistor region 13, and an over-sizing step of the substrate contact region 16 are carried out based upon the over-sizing values determined at the step S51 and the step S52 so as to define an over-sizing region. The over-sizing execution result of the above-described step S6 is conceptionally indicated as a layout data diagram of FIG. 6.

At a step S7, a latch-up verifying operation is carried out. That is, a logic calculation is carried out as to the transistor region 17 after the oversize is executed, the substrate contact region 18 after the over-sizing is executed, the source-sided transistor region 14, and furthermore, the drain-sided transistor region 15. As a result of this logic calculation, such an error transistor region 19 is outputted as latch-up verification data D4. This error transistor region 19 is located outside the region of the substrate contact region 18 after the over-sizing is executed.

As previously explained, in accordance with this second embodiment mode, since the process operations defined from the step S1 to the step S7 are carried out, the over-sizing step is executed, while the over-sizing values are separately set in correspondence with the dimensions of the transistor regions, and the distances separated from the well edges. As a consequence, the latch-up verification can be executed in high precision.

Third Latch-up Verifying Method

A latch-up verifying method, according to a third embodiment mode of the present invention, will now be described with reference to FIG. 7 through FIG. 9.

Figure 7:
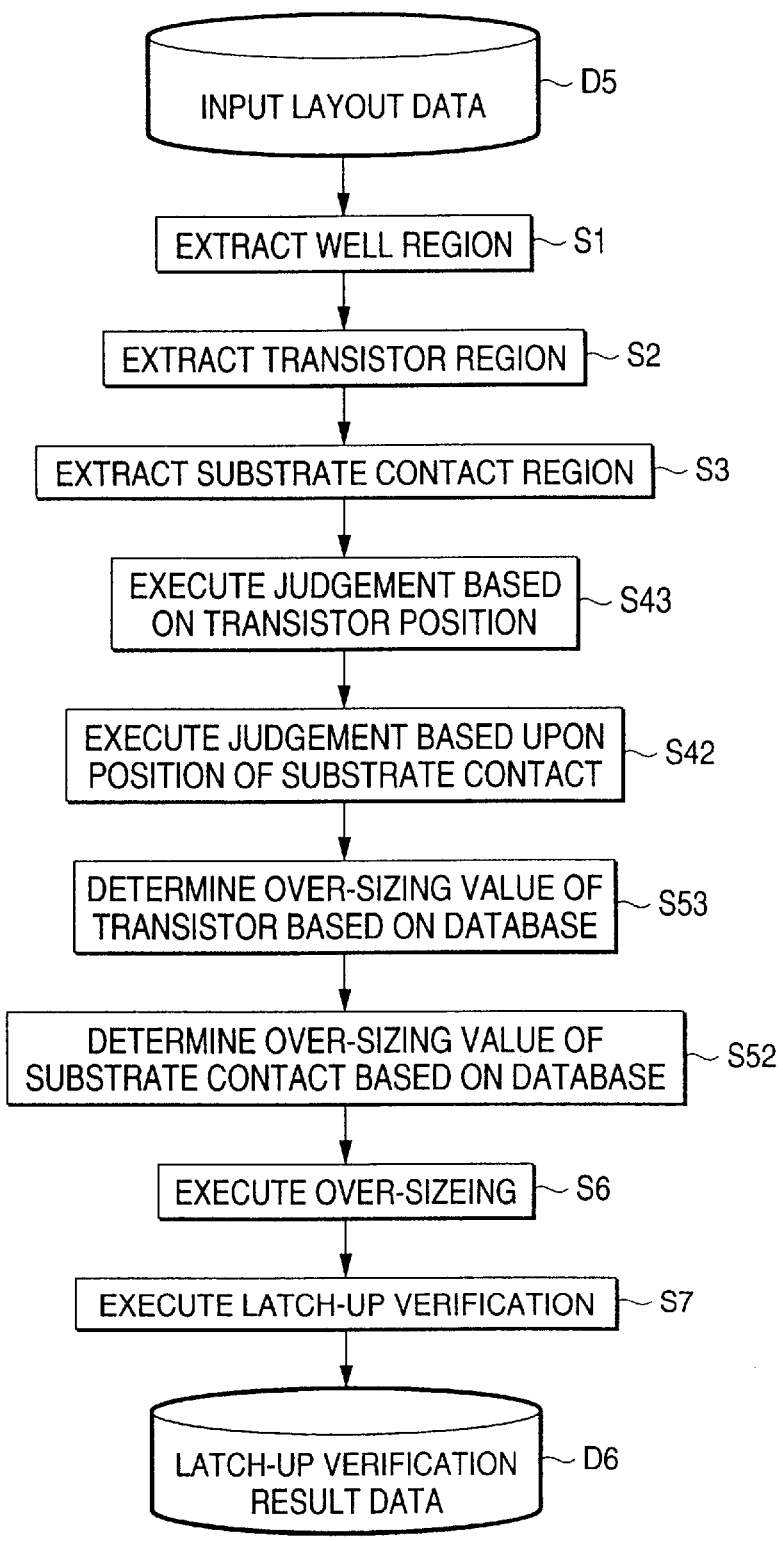
FIG. 7 is a flow chart for describing operations of a latch-up verifying method according to a third embodiment mode of the present invention.
Figure 8:
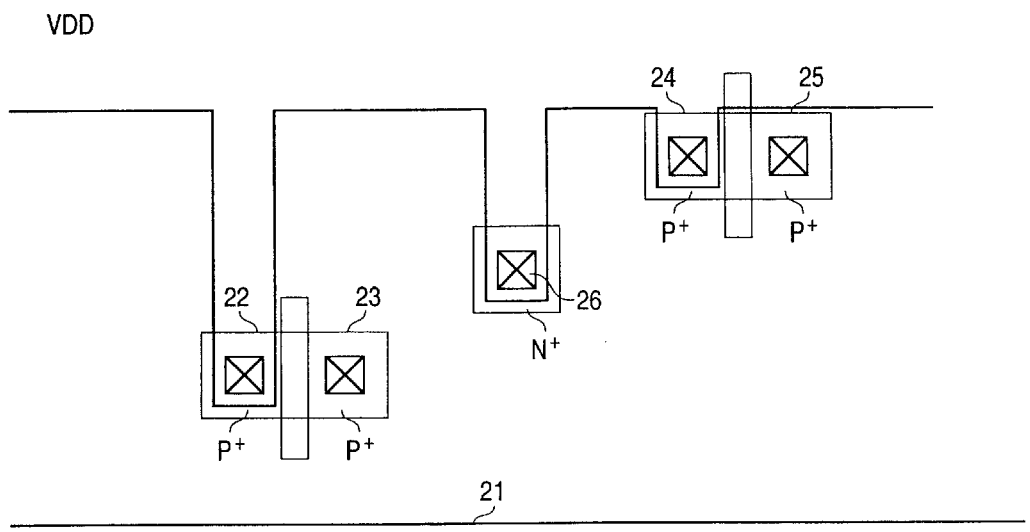
FIG. 8 is a diagram for illustratively showing layout data used to explain the latch-up verifying method of the third embodiment mode.

Input layout data D5 of a flow chart shown in FIG. 7 corresponds to a layout data diagram of FIG. 8. In FIG. 8, reference numeral 21 indicates a well boundary, reference numeral 22 shows a source-sided transistor region, and reference 23 represents a drain-sided transistor region. Also, reference numeral 24 shows a source-sided transistor region, reference numeral 25 indicates a drain-sided transistor region, and reference numeral 26 represents a substrate contact region. In FIG. 9, reference numeral 27 shows such a transistor region obtained by executing an over-sizing step as to the source-sided transistor region 22 and the drain-sided transistor region 23, reference numeral 28 indicates a substrate contact region obtained by executing an over-sizing step as to the substrate contact region 26, and reference numeral 29 represents an error transistor region obtained by executing a latch-up verification operation.

At a first step S1 of this flow chart, a well region is extracted from the above-explained input layout data D5. Thus, a well region 21 is extracted at this step S1. Next, at a step S2, a transistor region is extracted based upon the input layout data D5. At this step S2, the source-sided transistor region 22, the drain-sided transistor region 23 are extracted, and further, the source-sided transistor region 24 and the drain-sided transistor region 25 are extracted.

At a next step S3, the substrate contact region 26 is extracted from the input layout data D5.

At a step S43, a positional relationship between the transistor regions is judged based upon the extracted information acquired at the step S1 and the step S2. In this embodiment, these transistor regions are classified into two regions while setting a certain threshold value as a boundary, namely a transistor region located far from the well region 21, and another transistor region located close to the well region 21. Since the judgement is made based upon the distance from the well region 21 at the step S43, both the source-sided transistor region 22 and the drain-sided transistor region 23 are judged as such a transistor region located far from the well region 21.

Subsequently, similar to the second embodiment mode, at a step S42, positional relationships of the respective regions are judged based upon the extracted information acquired at the step S1, and the step S3. In this embodiment, these substrate contact regions are classified into two regions, while using a certain threshold value as a boundary, namely a substrate contact region located close to the well boundary 21, and another substrate contact region located far from the well boundary 21. Since the judgement is made based upon the contact position at the step S42, the substrate contact region 26 is judged as such a substrate contact region located close to the well region 21.

At a step S53, an over-sizing value of the source-sided transistor region 22 and an over-sizing value of the drain-sided transistor region 23 are determined as an "R4".

Next, similar to the second embodiment mode, at a step S52, an over-sizing value of the substrate contact region 26 is determined as an "R1".

Based upon the over-sizing values determined at the previous steps S53 and S52, over-sizing steps for the source-sided transistor region 22, the drain-sided transistor region 23, and the substrate contact region 26 are carried out at a step S6.

Figure 9:
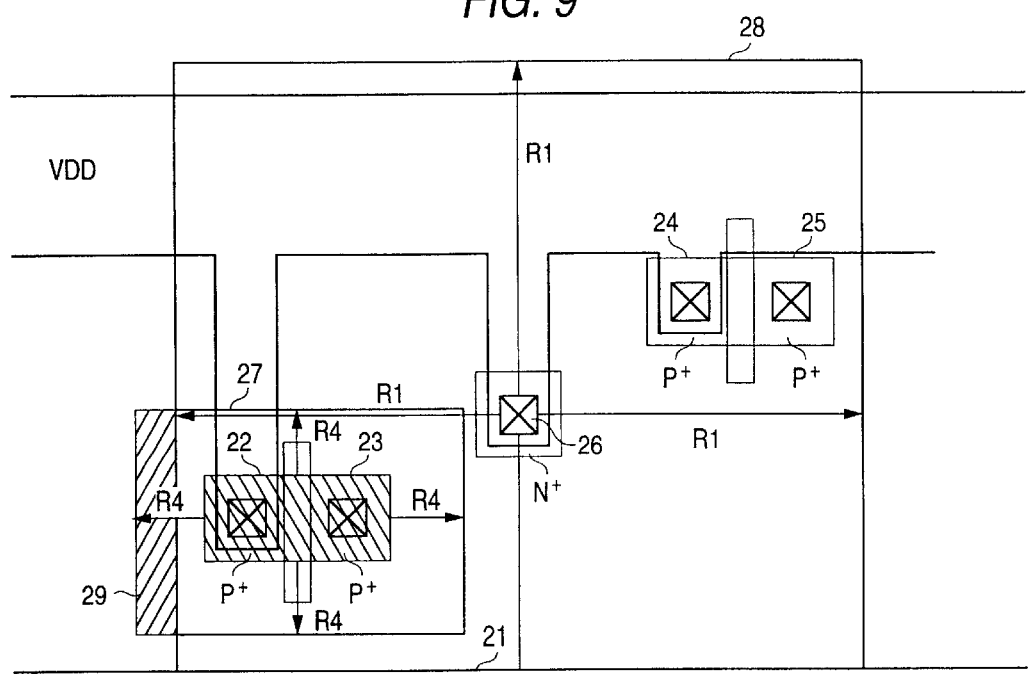
FIG. 9 is a diagram for illustratively representing another layout data used to explain the latch up verifying method of the third embodiment mode.

The over-sizing execution result of this step S6 is conceptionally indicated as a layout data diagram of FIG. 9.

At a step S7, a latch-up verifying operation is carried out. That is, a logic calculation is carried out as to the transistor region 27 after the oversize step is executed, the substrate contact region 28 after the over-sizing step is executed, the source-sided transistor region 22, and furthermore, the drain-sided transistor region 23. As a result of this logic calculation, such an error transistor region 29 is outputted as latch-up verification data D6. This error transistor region 29 is located outside the regions of the substrate contact region 28 after the over-sizing step is executed.

As previously explained, in accordance with this third embodiment mode, since the process operations defined from the step S1 to the step S7 are carried out, while the over-sizing values are separately set by considering the distances of the transistor region and the substrate contact region from the well region, the over-sizing can be executed. As a consequence, the latch-up verification can be executed in high precision.

Fourth Latch-up Verifying Method

A latch-up verifying method, according to a fourth embodiment of the present invention, will now be explained with reference to FIG. 10 to FIG. 12.

Figure 10:
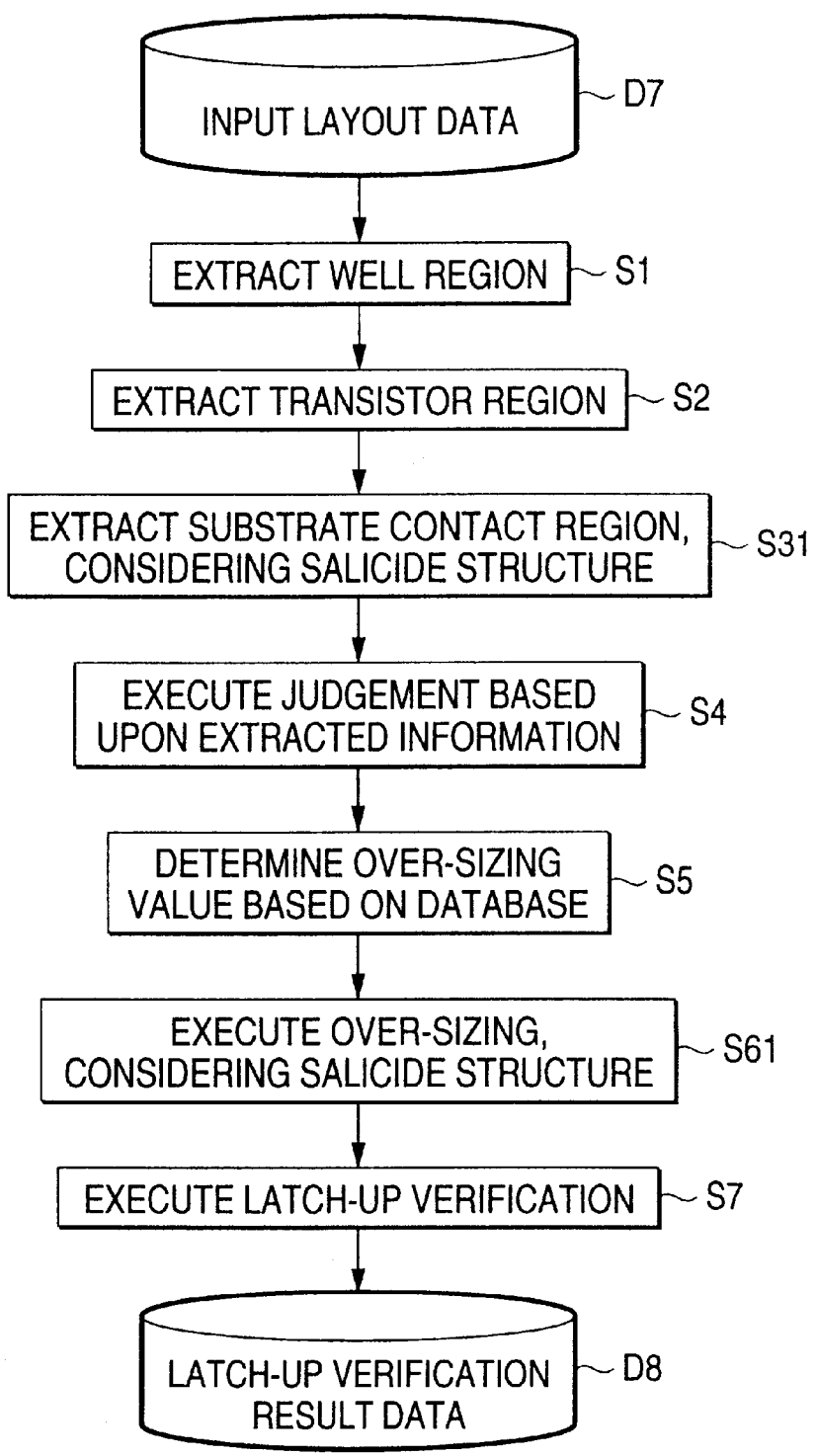
FIG. 10 is a flow chart for describing operations of a latch-up verifying method according to a fourth embodiment mode of the present invention.
Figure 11:
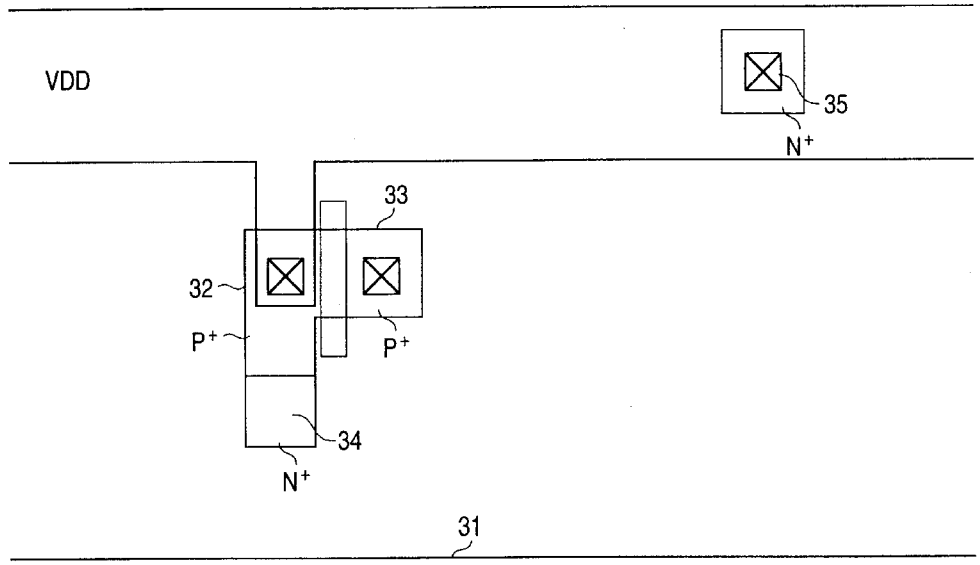
FIG. 11 is a diagram for illustratively showing layout data used to explain the latch-up verifying method of the fourth embodiment mode.

Input layout data D7 of a flow chart shown in FIG. 10 corresponds to a layout data diagram of FIG. 11. The input data of FIG. 11 corresponds to such data designed in a process equipped with a salicide structure. In FIG. 11, reference numeral 31 indicates a well boundary, reference numeral 32 shows a source-sided transistor region, and reference 33 represents a drain-sided transistor region. Also, reference numeral 34 shows a surface contact region without having a contact, and reference numeral 35 shows a via-hole-containing contact region equipped with a contact.

Figure 12:
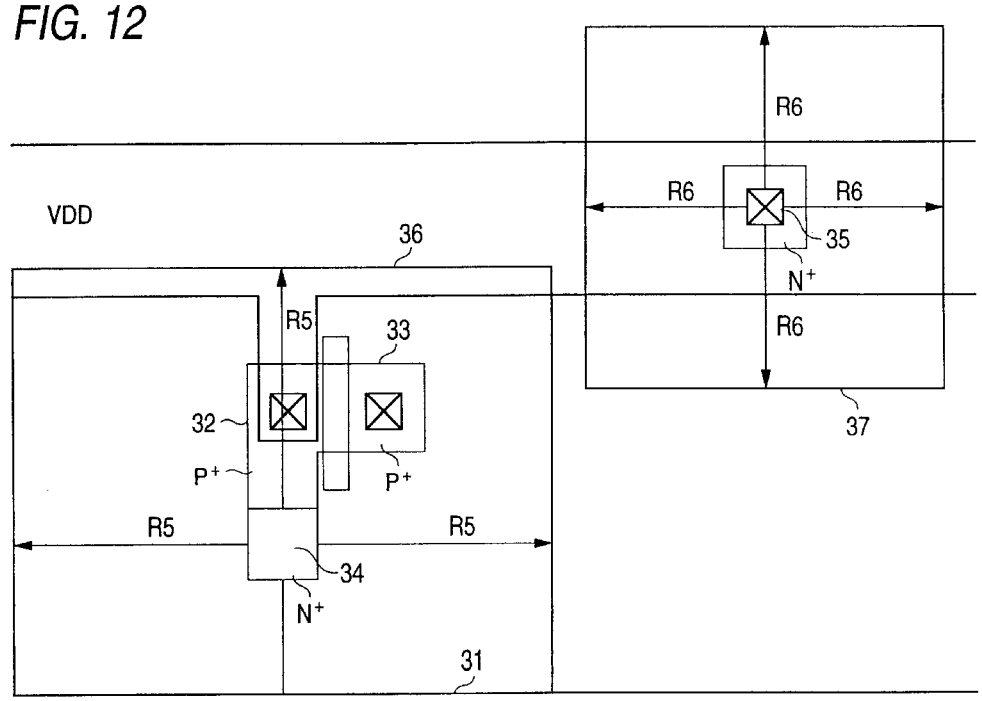
FIG. 12 is a diagram for illustratively representing another layout data used to explain the latch up verifying method of the fourth embodiment mode.
Figure 13:
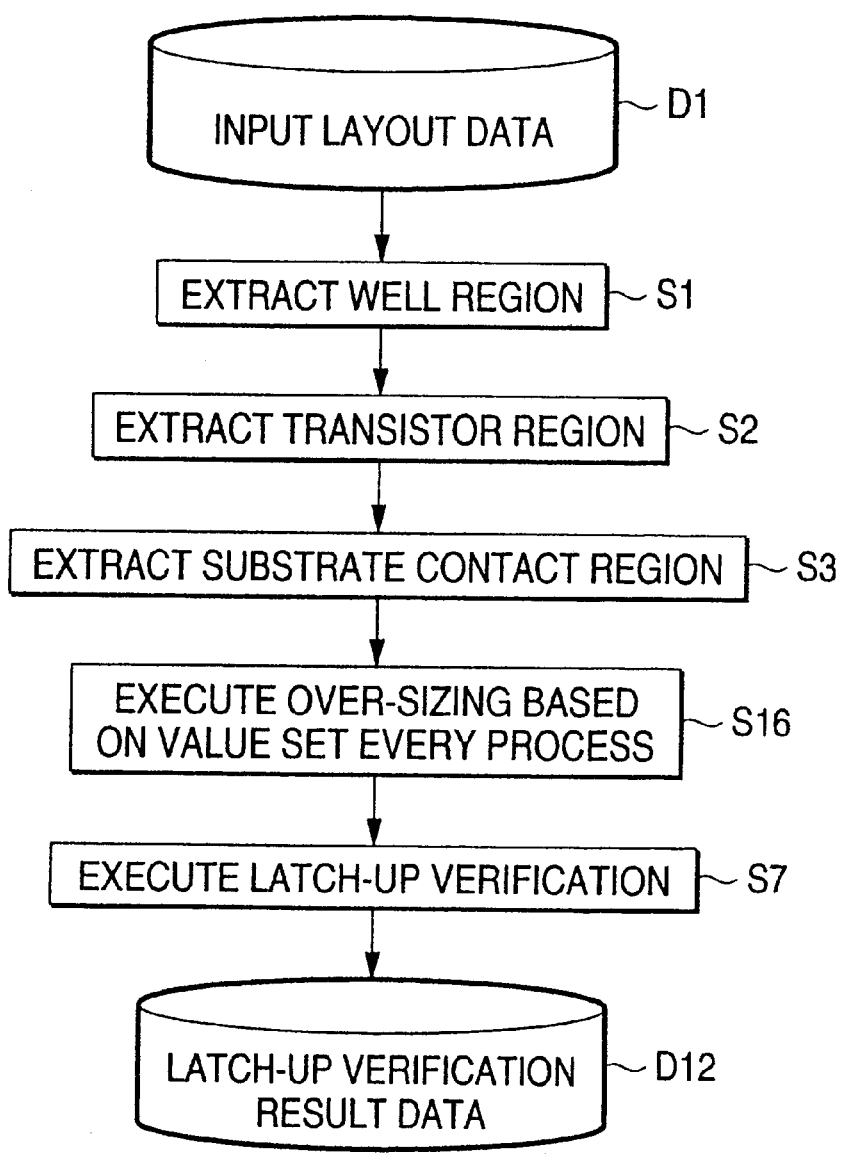
FIG. 13 is a flow chart for describing operations of the conventional latch-up verifying method.

Also, in FIG. 12, reference numeral 36 shows an over-sizing surface contact region obtained after the over-sizing step is executed as to the substrate contact region 34 without having the contact, and reference number 37 indicates a contact region containing an over-sized contact obtained after the over-sizing step is executed.

At a first step S1 of this flow chart, a well region is extracted from the above-explained input layout data D7. Thus, the well boundary 31 can be extracted at this step S1.

Next, at a step S2, a transistor region is extracted based upon the input layout data D7. At this step S2, both the source-sided transistor region 32 and the drain-sided transistor region 33 can be extracted.

At a next step S31, both the surface contact region 34 having the contact and the via-hole-containing contact region 35 having the contact are extracted from the input layout data D7, considering the salicide structure.

Similar to the first embodiment mode, at a step S4, a positional relationship among the respective regions is judged based upon the extracted information acquired at the step S1, the step S2, and the step S31. In this embodiment, this positional relationship is judged by checking as to whether or not a distance from the well boundary 31 is longer than a certain threshold value. At this step S4, the surface contact region 34 is judged as such a substrate contact region which is located close to the well boundary 31 and is not equipped with the contact, whereas the substrate contact region 35 equipped with the contact is judged as such a via-hole-containing contact region which is located far from the well boundary 31 and is equipped with the contact.

Next, at a step SD, an over-sizing value of the surface contact region 34 having no contact is determined as an R5, and an over-sizing value of the via-hole-containing contact region 5 having the contact is determined as an R6 (condition is R5>R6).

At a further step S61, an over-sizing step is carried out based upon the oversize values determined at the previous step SD considering the salicide structure.

The over-sizing execution result of this step S61 is conceptionally indicated as a layout data diagram of FIG. 12.

At a step S7, a latch-up verifying operation is carried out. That is, a logic calculation is carried out as to the over-sized surface contact region 36 after the oversize step is executed, the over-sized via-hole-containing contact region 37 after the over-sizing step is executed, the source-sided transistor region 32, and furthermore, the drain-sided transistor region 33. As a result of this logic calculation, such an error transistor region is outputted as latch-up verification data D8. This error transistor region is located outside the regions of the over-sized surface contact region 36 and of the over-sized via-hole-containing contact region 37 after the over-sizing step is executed.

As previously explained, in accordance with this first embodiment mode, since the process operations defined from the step S1 to the step S7 are carried out, while the over-sizing values are separately set by checking as to whether or not the position of the contact and the via hole are contained, the over-sizing can be executed. As a consequence, the latch-up verification can be executed in high precision.

Modifications and other Embodiment Modes

In the above-described embodiment modes, the transistor region is the PMOS transistor, and the substrate contact region is the N type diffusion region. Alternatively, the PMOS transistor may be replaced by an NMOS transistor, and the N type diffusion region may be replaced by a P type diffusion region.

In the above-explained first embodiment mode, the over-sizing value database at the step SD is formed in the digital display table format; in the second embodiment mode, the over-sizing value databases at the step S51 and the step S52 are formed in the digital display table format; in the above-explained third embodiment mode, the over-sizing value databases at the steps S52 and S53 are formed in the digital display table format; and in the fourth embodiment mode, the over-sizing value database at the step SD is formed in the digital display table format. Alternatively, these steps may be realized as steps for determining the over-sizing values by using a function of an analog display.

Also, in the above-described embodiment modes, the over-sizing value along the horizontal direction is the same as the over-sizing value along the vertical direction. Alternatively, these over-sizing values may be made different from each other along both the horizontal direction and the vertical direction.

Also, in the above-explained embodiment mode, the judgement result is subdivided into two stages. Alternatively, this judgement result may be subdivided into more than three steps. As a result, it is apparently possible to obtain a judgement result in higher precision.

Figure 14:
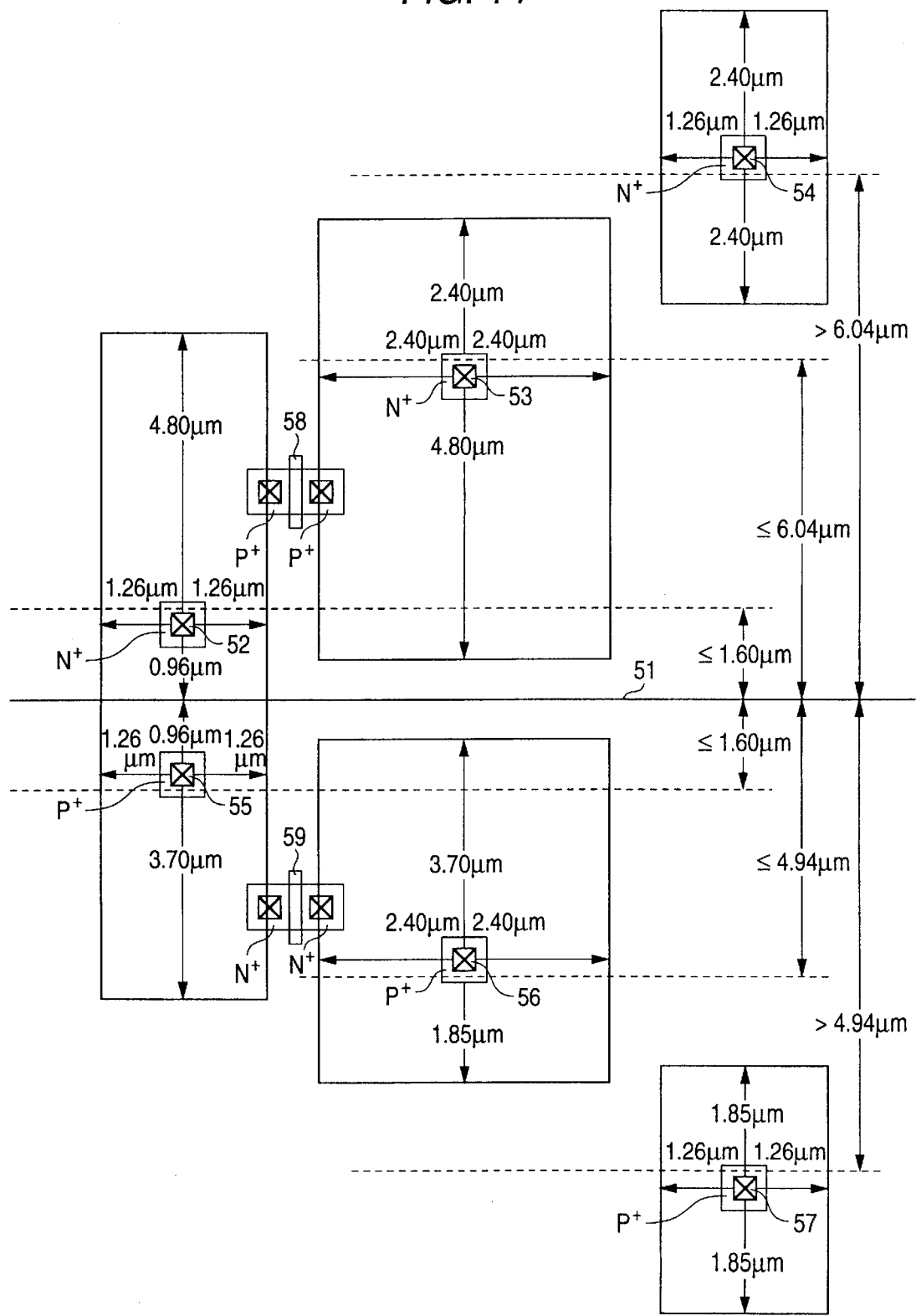
FIG. 14 is a diagram for illustratively showing layout data used to explain the latch-up verifying method of a fifth embodiment mode.

FIG. 14 schematically indicates a latch-up verifying method according to a fifth embodiment mode of the present invention. As indicated in FIG. 14, while a judgement result is subdivided into multiple-staged judgement results, over-sizing values are determined as to both a P+ transistor region 58 and an N+ transistor region 59. The P+ transistor region 58 is formed in an N type well region, and the N+ transistor region 59 is formed in a P type substrate surface, while setting a well boundary 51 as a boundary. Further, over-sizing values are determined with respect to N type substrate contact regions 53/54, and P type substrate contact regions 56/57, while considering various aspects, namely, distances of the respective regions defined from the well boundary 51, conductivity types, and horizontal/vertical directions of the respective transistor regions. In this drawing, concrete numeral values are represented as one example. It should be understood that a region for surrounding outside portions of arrows corresponds to an over-sizing region.

Figure 15:
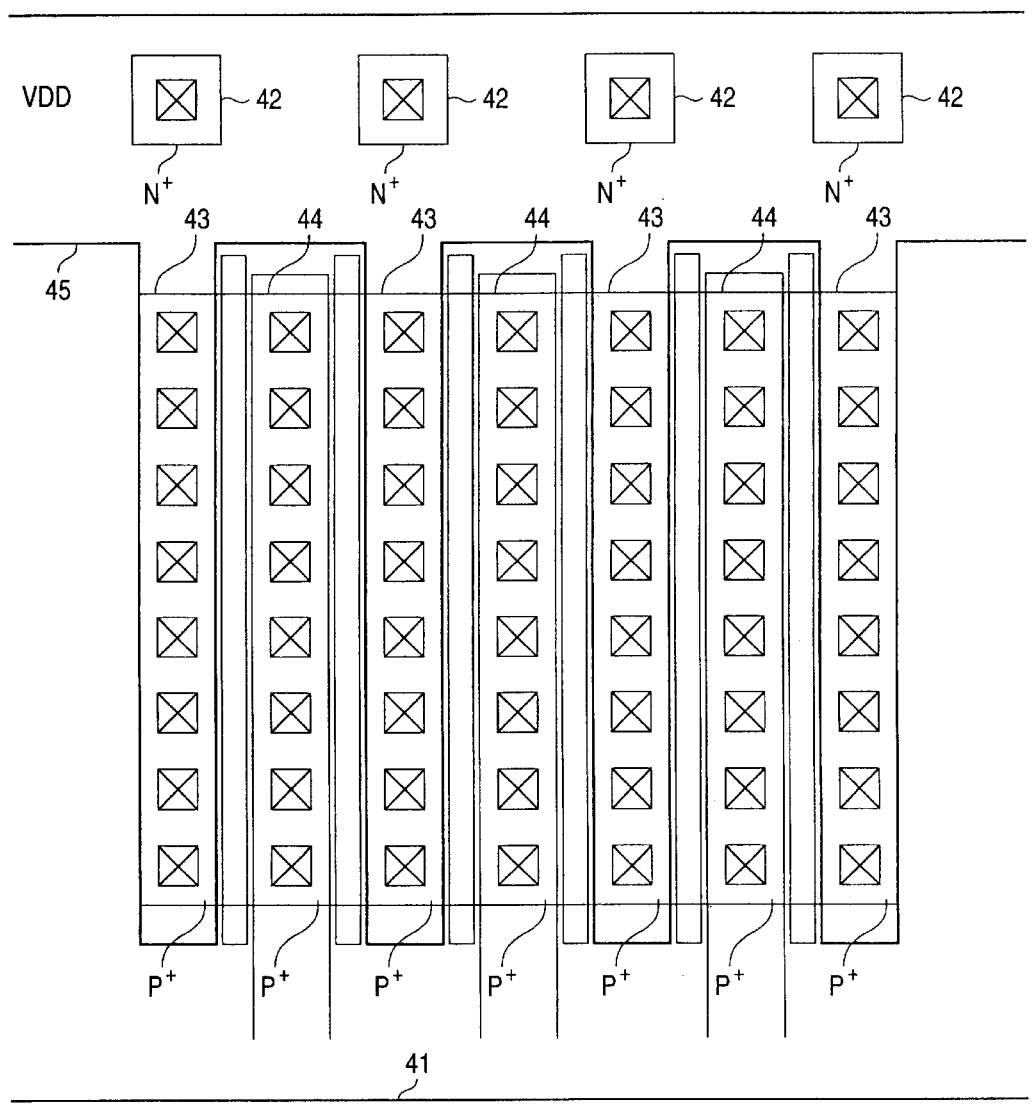
FIG. 15 is a diagram for illustratively representing layout data used to explain the latch-up verifying method of a sixth embodiment mode.
Figure 16:
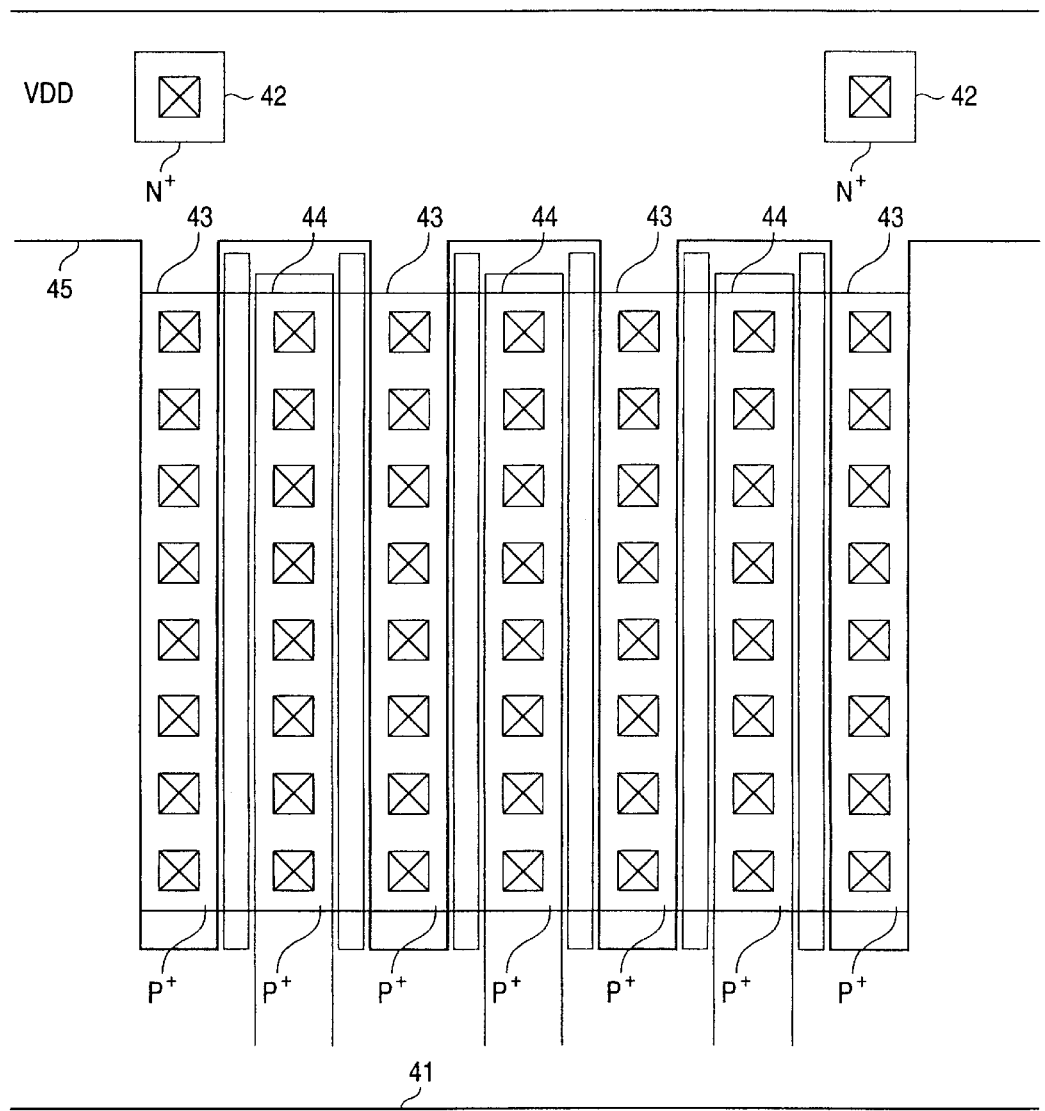
FIG. 16 is a diagram for illustratively showing layout data used to explain the latch-up verifying method of a seventh embodiment mode.

In the above-explained embodiment modes, the respective regions are considered. Alternatively, as a sixth embodiment mode and a seventh embodiment mode of the present invention, a description will now be made of such a structure that a large number of transistor arrays are arranged in a DRAM and the like. FIG. 15 is a diagram for showing layout data according to the sixth embodiment mode. In FIG. 15, reference numeral 41 indicates a well boundary; reference numeral 42 shows a substrate contact region; reference numeral 43 denotes a source-sided transistor region; and reference numeral 44 represents a drain-sided transistor region. In this embodiment mode, one set of this substrate contact region 42 is provided per two sets of transistors, and the arranging pitch of the substrate contact regions 42 is selected to be 1.8 $\mu$m. Also, FIG. 16 is a diagram for representing layout data according to the seventh embodiment mode. In this embodiment mode, one set of this substrate contact region 42 is provided per 6 sets of transistors, and the arranging pitch of the substrate contact regions 42 is selected to be 5.4 $\mu$m.

Figure 17:
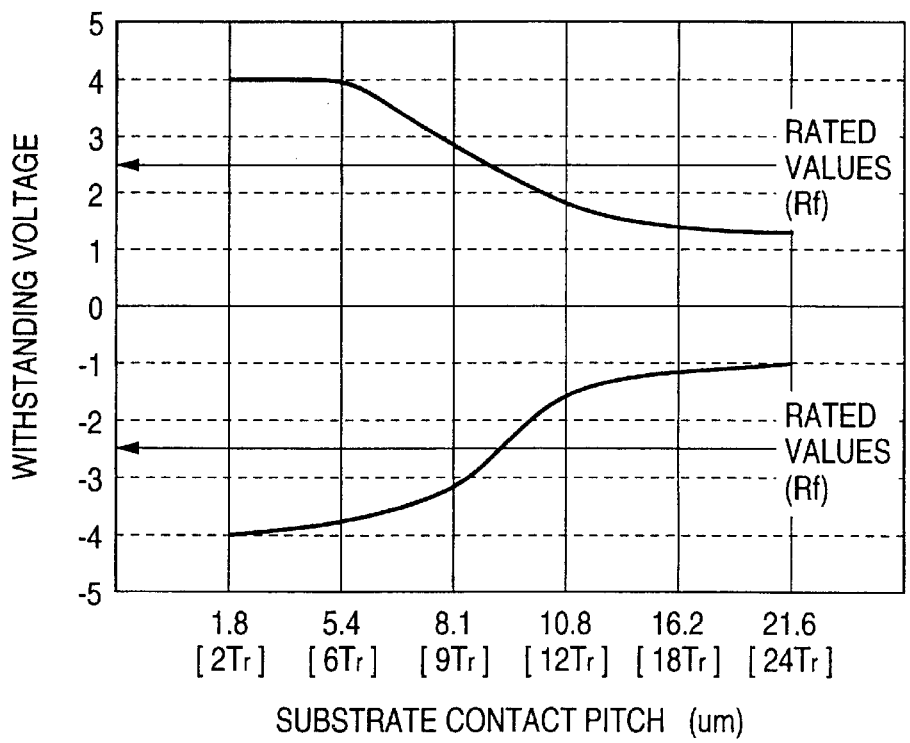
FIG. 17 graphically showing a result of measuring a relationship between a contact pitch and a withstanding voltage.
Figure 18:
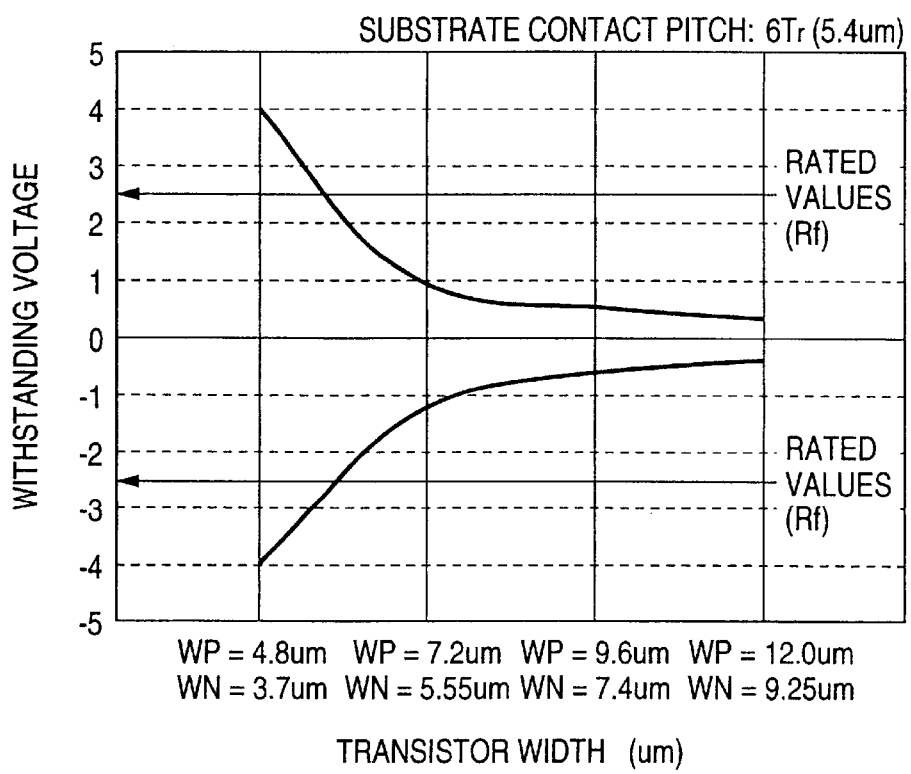
FIG. 18 graphically representing a result of measuring a relationship between a width of a transistor and a withstanding voltage.

FIG. 17 graphically represents actually measured results indicative of a relationship between a contact pitch and a withstanding voltage. An abscissa of FIG. 17 indicates the contact pitch, and an ordinate thereof shows an arbitrary value. Symbol "Rf" denotes a rated value. As apparent from this graphical relationship, the over-sizing value may be determined in such a manner that the withstanding voltage becomes higher than this rated value. Also, as apparent from this graphic representation, the substrate contact pitch is effective up to 9 transistors. FIG. 18 graphically represents an actually measured result with respect to a relationship between a width and a withstanding voltage as to such a case that while a substrate contact pitch is made constant (6 transistors), a width of a transistor region is varied. An abscissa of this graphic representation shows a width of a transistor. It should be noted that an upper stage "WP" corresponds to a case of a P type transistor, and a lower stage "WN" corresponds to a case of an N type transistor. Symbol "Rf" shows a rated value. As apparent from this graphic representation, an over-sizing value may be determined every transistor width in such a manner that a withstanding voltage becomes higher than this rated value.

In the fourth embodiment mode, the salicide structure is considered. As apparent from the foregoing description, in the layout data equipped with the salicide structure, the judgement results may be obtained in higher precision even in such a case that the salicide structure is considered in the first embodiment mode, the second embodiment mode, and the third embodiment mode.

Figure 19:
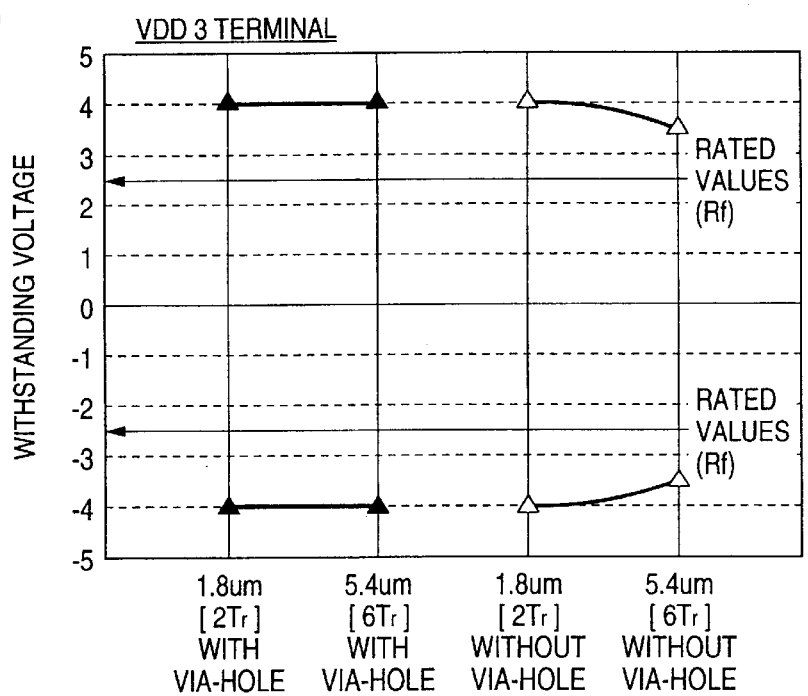
FIG. 19 graphically indicates a relationship between a withstanding voltage and presence/absence of a via-hole in a contact region (in case of VDD3 terminal)
Figure 20:
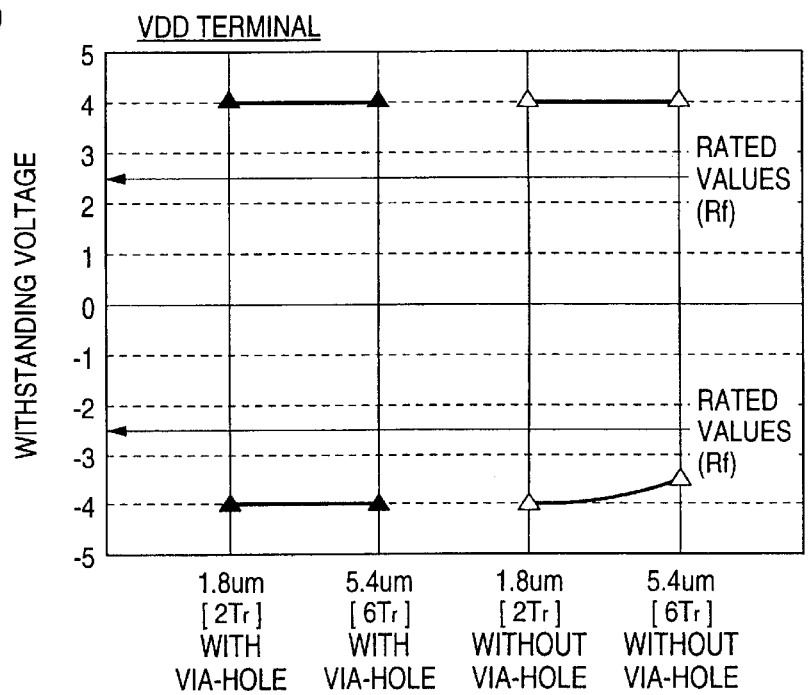
FIG. 20 graphically indicates a relationship between a withstanding voltage and presence/absence of a via-hole in a contact region (in case of VDD terminal)

FIG. 19 and FIG. 20 graphically show measurement results obtained by measuring a relationship between a withstanding voltage and presence/absence of a via-hole. In these drawings, a white blank portion indicates a measurement result of a withstanding voltage in the case of a contact region without having a via-hole, namely, a surface contact region. A black solid portion shows a measurement result of a withstanding voltage in the case of a contact region having a via-hole, namely a vial-hole-containing contact region.

FIG. 19 and FIG. 20 graphically represent actually measured results indicative of a relationship between a contact pitch and a withstanding voltage. An abscissa of each drawing indicates the contact pitch, and an ordinate thereof shows an arbitrary value. Symbol "Rf" denotes a rated value. As apparent from these graphical relationships, the over-sizing value may be determined in such a manner that the withstanding voltage becomes higher than this rated value. Also, FIG. 19 corresponds to a case of a VDD 3 terminal, and FIG. 20 corresponds to a case of a VDD terminal. From these measurement results, the following facts can be seen. That is, there is no difference in presence/absence of via-holes, and in substrate contact pitches, and all of these values are higher than, or equal to the rated value, namely indicate sufficiently high withstanding voltages.

As previously described in detail, in accordance with the present invention, when the latch-up verification is carried out with respect to the layout data, this latch-up verification can be carried out in high precision by executing the over-sizing step in the following manner. That is, after the well region, the transistor region, and the substrate contact region have been extracted based upon the layout data, the over-sizing values are separately set in accordance with either the structural conditions of the above-explained regions or the use conditions thereof.

What is claimed is:

1. A latch-up verifying method, comprising the steps of:
    extracting a well region, at least one transistor region, and at least one substrate contact region from layout data of a semiconductor integrated circuit to be formed on a semiconductor substrate;
    setting an over-sizing value for at least one of said at least one transistor region and/or at least one of said at least one substrate contact region based upon the extracted information; and
    executing latch-up verification of the layout data utilizing the separately set over-sizing value.

2. A latch-up verifying method according to claim 1, wherein:
    said method includes a step for forming a database used to store over-sizing values;
    said extracting step includes a first extraction step for extracting a well region from said layout data, a second extraction step for extracting the at least one transistor region from said layout data, and a third extraction step for extracting the at least one substrate contact region from said layout data;
    wherein said steps of setting over-sizing values includes determining an over-sizing value based upon said extracted information obtained from said first extraction step to said third extraction step;
    said method further includes a step for defining an over-sized region based upon said determined over-sizing value; and
    said step of executing the latch-up verification includes checking as to whether or not the transistor region is contained within the over-sized region defined at said definition step.

3. A latch-up verifying method according to claim 1, wherein:
    said over-sizing determination step is arranged by determining the over-sizing value based upon one of a structural condition and a use condition of the at least one transistor region of said semiconductor integrated circuit.

4. A latch-up verifying method according to claim 1, wherein:
    said over-sizing determination step is arranged by determining the over-sizing value based upon a position relationship among said at least one transistor region, said well region, and said at least one substrate contact region.

5. A latch-up verifying method according to claim 1, wherein:
    said over-sizing determination step is arranged by determining the over-sizing value based upon a distance defined between said well region and said at least one transistor region.

6. A latch-up verifying method according to claim 1, wherein:
    said over-sizing determination step is arranged by determining the over-sizing value based upon a distance defined between said well region and said at least one substrate contact region.

7. A latch-up verifying method according to claim 1, wherein:
    said over-sizing determination step is arranged by determining the over-sizing value, while considering a dimension of the at least one transistor region.

8. A latch-up verifying method according to claim 1, wherein:
    said over-sizing determination step is arranged by determining the over-sizing value, while considering a gate length and/or a gate width of the at least one transistor region.

9. A latch-up verifying method according to claim 1, wherein:
    said over-sizing determination step is arranged by determining the over-sizing value in correspondence with a current capability of said at least one transistor region of said semiconductor integrated circuit.

10. A latch-up verifying method according to claim 1, wherein:
    said semiconductor integrated circuit is equipped with a salicide wiring structure;
    said at least one substrate contact region is constituted by a via-hole-containing contact region for contacting through a via-hole within said semiconductor substrate, and a surface contact region formed on a surface of the semiconductor substrate, while does not contact through a via-hole within said semiconductor substrate; and
    said over-sizing determining step judges as to whether said at least one substrate contact region is the via-hole-containing contact region, or the surface contact region, and is arranged by reducing the over-sizing value in the case that said substrate contact region is the surface contact region.

11. A latch-up verifying method according to claim 1, wherein:
    said step of setting an over-sizing value includes the use of a function wherein one of a structural characteristic and an electric characteristic of the at least one transistor region of said semiconductor integrated circuit is used as a parameter.

12. A latch-up verifying method according to claim 1, wherein:
    said steps of setting an over-sizing value includes the use of a table containing a parameter made of one of a structural characteristic and an electric characteristic of each of the at least one transistor region of said semiconductor integrated circuit.

13. A latch-up verifying method according to claim 1, wherein:
one over-sizing value along a horizontal direction is made different from another over-sizing value along a vertical direction.

14. A latch-up verifying method according to claim 1, wherein:
an over-sizing value at a right hand along a horizontal direction is made different from an over-sizing value at a left hand along said horizontal direction.

15. A latch-up verifying method according to claim 1, wherein:
an over-sizing value at an upper hand along a vertical direction is made different from an over-sizing value at a lower hand along the vertical direction.

16. A latch-up verifying method, comprising the steps of:
extracting a well region, at least one transistor region, and at least one substrate contact region from layout data of a semiconductor integrated circuit to be formed on a semiconductor substrate;
sequentially executing steps for separately setting respective over-sizing values for at least one of the transistor region and at least one of the substrate contact region based upon the extracted information; and
executing latch-up verification of the layout data utilizing the separately set over-sizing value.

17. A latch-up verifying apparatus including:
means for extracting a well region, at least one transistor region, and at least one substrate contact region from layout data of a semiconductor integrated circuit formed on a semiconductor substrate; and
means for setting an over-sizing value for at least one of said at least one transistor region and/or at least one of said at least one substrate contact region based upon the extracted information; and
means for executing latch-up verification of the layout data utilizing the separately set over-sizing values.

18. A latch-up verifying apparatus according to claim 17, wherein:
said apparatus further includes
a database used to store over-sizing values;
said means for extracting including first extraction means for extracting a well region from said layout data, second extraction means for extracting the at least one transistor region from said layout data, and third extraction means for extracting the at least one substrate contact region from said layout data;
said means for setting over-sizing values includes determination means for determining an over-sizing value based upon said extracted information obtained from said first extraction means to said third extraction means;
said apparatus further includes definition means for defining an over-sizing region based upon said determined over-sizing value; and
said means for executing the latch-up verification includes means for checking as to whether or not the transistor region is contained within the over-sizing region defined at said definition means.

19. A latch-up verifying apparatus according to claim 17, wherein:
said determination means is arranged by determining the over-sizing value based upon a position relationship among said at least one transistor region, said well region, and said at least one substrate contact region.

20. A latch-up verifying apparatus according to claim 17, wherein:
said determining means is arranged by determining the over-sizing value based upon a distance defined between said well region and said at least one transistor region.

21. A latch-up verifying apparatus according to claim 17, wherein:
said determination means is arranged by determining the over-sizing value based upon a distance defined between said well region and said at least one substrate contact region.

22. A latch-up verifying apparatus according to claim 17, wherein:
said determination means is arranged by determining the over-sizing value, while considering a dimension of the at least one transistor region.

23. A latch-up verifying apparatus according to claim 17, wherein:
said determination means is arranged by determining the over-sizing value, while considering a gate length and/or a gate width of the at least one transistor region.

24. A latch-up verifying apparatus according to claim 17, wherein:
said determination means is arranged by determining the over-sizing value in correspondence with a current capability of each of said at least one transistor region of said semiconductor integrated circuit.

25. A latch-up verifying apparatus according to claim 17, wherein:
said over-sizing value database is constituted by a function that one of a structural characteristic and an electric characteristic of the at least one transistor region of said semiconductor integrated circuit is used as a parameter; and the over sizing value is determined by said function.

26. A latch-up verifying apparatus according to claim 17, wherein:
said over-sizing value database is constituted by a table containing a parameter made of one of a structural characteristic and electrical characteristic of the at least one transistor regions of said semiconductor integrated circuit; and the over-sizing value is determined by said table.

27. A latch-up verifying apparatus including:
means for extracting a well region, at least one transistor region, and at least one substrate contact region from layout data of a semiconductor integrated circuit formed on a semiconductor substrate; and
means of sequentially, separately setting over-sizing values for at least one of the transistor region and at least one of the substrate contact region based upon the extracted information; and
means for executing latch-up verification for the layout data utilizing the separately set over-sizing values.

* * * * *

UNITED STATES PATENT AND TRADEMARK OFFICE
CERTIFICATE OF CORRECTION

PATENT NO. : 6,718,528 B2
DATED : April 6, 2004
INVENTOR(S) : Shinichi Kimura et al.

It is certified that error appears in the above-identified patent and that said Letters Patent is hereby corrected as shown below:

Column 9,
Lines 30 and 36, please delete "SD" and insert therefor -- S5 --.

Column 13,
Lines 1, 8, 40 and 47, please delete "SD" and insert therefor -- S5 --.

Signed and Sealed this

Thirtieth Day of November, 2004

JON W. DUDAS
*Director of the United States Patent and Trademark Office*